United States Patent
Fritsch et al.

(10) Patent No.: US 7,592,771 B2
(45) Date of Patent: Sep. 22, 2009

(54) METHOD FOR OPERATING A TWO-PHASE ROTARY CURRENT CONTROLLER

(75) Inventors: Andreas Fritsch, Kümmersbruck (DE); Gerd Griepentrog, Gutenstetten (DE); Diethard Runggaldier, Stegaurach (DE)

(73) Assignee: Siemens Aktiengesellschaft, Munich (DE)

( * ) Notice: Subject to any disclaimer, the term of this patent is extended or adjusted under 35 U.S.C. 154(b) by 404 days.

(21) Appl. No.: 11/659,214

(22) PCT Filed: Jul. 28, 2005

(86) PCT No.: PCT/EP2005/053698

§ 371 (c)(1),
(2), (4) Date: Feb. 2, 2007

(87) PCT Pub. No.: WO2006/015952

PCT Pub. Date: Feb. 16, 2006

(65) Prior Publication Data

US 2008/0297089 A1    Dec. 4, 2008

(30) Foreign Application Priority Data

Aug. 5, 2004    (DE) .................... 10 2004 038 111

(51) Int. Cl.
*H02P 1/26*    (2006.01)

(52) U.S. Cl. .................... 318/778; 318/437; 318/504; 318/506

(58) Field of Classification Search ......... 318/430–434, 318/437, 445, 484, 504–507, 778
See application file for complete search history.

(56) References Cited

U.S. PATENT DOCUMENTS

| 3,497,796 | A | * | 2/1970 | Konrad ..................... 323/320 |
| 3,876,918 | A | * | 4/1975 | Komuro et al. ............ 318/743 |
| 4,042,069 | A | * | 8/1977 | Ohira et al. ................. 187/296 |
| 4,101,819 | A | | 7/1978 | Maeda et al. |
| 4,636,702 | A | * | 1/1987 | Hedges ...................... 318/729 |
| 5,128,604 | A | * | 7/1992 | Caen .......................... 323/319 |
| 5,682,091 | A | | 10/1997 | Williamson et al. |
| 6,111,377 | A | * | 8/2000 | Hertzog et al. ......... 318/400.26 |
| 6,870,333 | B2 | * | 3/2005 | Griepentrog et al. ....... 318/257 |

FOREIGN PATENT DOCUMENTS

| DE | 199 62 292 | 8/2001 |
| GB | 1 227 963 | 4/1971 |
| JP | 2001268958 | 9/2001 |
| WO | WO 01/48903 | 7/2001 |

* cited by examiner

*Primary Examiner*—Bentsu Ro
(74) *Attorney, Agent, or Firm*—Harness, Dickey & Pierce, P.L.C.

(57) ABSTRACT

A method is disclosed for operating a two-phase rotary current controller. In order to optimize the operation of a two-phase rotary current controller, magnitudes of a parameter that can be varied in both controllable phases of a two-phase rotary current controller is matched in these phases. In particular, the existing principle of phase-symmetric control with a uniform ignition delay in both controlled outer conductors is abandoned, and a separate ignition delay is stipulated for each of the two controlled outer conductors.

12 Claims, 3 Drawing Sheets

METHOD FOR OPERATING A TWO-PHASE ROTARY CURRENT CONTROLLER

This application is the national phase under 35 U.S.C. § 371 of PCT International Application No. PCT/EP2005/053698 which has an International filing date of Jul. 28, 2005, which designated the United States of America and which claims priority on German Patent Application number DE 10 2004 038 111.9 filed Aug. 5, 2004, the entire contents of which are hereby incorporated herein by reference.

FIELD

Embodiments of the invention generally relate to a method for operation of a two-phase three-phase controller. Embodiments of the invention also generally relate to a two-phase three-phase controller.

BACKGROUND

Three-phase controllers use the principle of phase gating to control the electrical power which is supplied to an electrical load, in particular an asynchronous machine. In the case of asynchronous machines, this control of the power supply makes it possible to reduce the starting currents and the starting torque, and thus to achieve so-called soft starting. This so-called trigger delay $\alpha$, which is also referred to as a delay is used as a measure for control purposes. The load which is connected to the output of the three-phase controller has current half-cycles of alternate polarity flowing through it with a time period in which no current flows and which is governed by the phase gating being located between each two successive current half-cycles.

The power sections of three-phase controllers are normally equipped with three sets of thyristors connected back-to-back in parallel. Since the costs for the thyristors are, however, the cost-driving factor of the entire appliance as the rating of the three-phase controller increases, three-phase controllers are also used having only two sets of thyristors connected back-to-back in parallel. In these so-called two-phase three-phase controllers, the remaining outer conductor is in the form of a conductor which cannot be connected.

One side effect of this two-phase three-phase controller of simplified design is that the root mean square values of the currents in the two controlled outer conductors are different, despite the same phase gating angles being used. This effect is caused by the magnetic interaction between the three outer conductor currents in the driven asynchronous machine, and is dependent on the rotation direction of the power supply system and/or of the asynchronous machine.

Because the current magnitudes are not the same, the power semiconductors (thyristors) as well as their heat sinks must be designed for higher values than necessary since it is necessary to cope with the respectively higher current. Which of the two currents is higher in the controlled outer conductors depends on the rotation direction of the connected power supply system, and can accordingly vary. This effect has been taken into account in the past by designing the power semiconductors such that each of the two valve sets in the two controlled outer conductors can carry the higher current.

SUMMARY

In at least one embodiment of the present invention, the operation of a two-phase three-phase controller is improved, or even optimized.

One fundamental idea of at least one embodiment of the invention is that magnitudes of a parameter which can be varied in the two controllable phases of a two-phase three-phase controller can be matched in these phases.

In particular, the previous principle of phase-balanced control using the same standard trigger delay in the two controlled outer conductors is dispensed with, and a specific trigger delay is predetermined for each of the two controlled outer conductors. In other words, phase-unbalanced control is used in such a manner that the root mean square values of the currents in the two controlled phases are matched to one another. The matching is in this case carried out in particular during starting of the asynchronous machine in order to avoid the parameter differences which occur there. In principle, the matching can also be carried out during normal operation.

As a result of the parameter values, in particular currents, which are approximated to one another by way of the "phase balancer principle" according to at least one embodiment of the invention, in the two controlled outer conductors, the valve sets (power semiconductors) that are used need no longer be designed for the maximum value to be expected. It is sufficient for safe operation to design for the lower mean value of the two outer conductors. This allows a considerable cost saving. A further advantage of the method according to at least one embodiment of the invention is the more uniform load on the power supply system. Furthermore, automatic parameter matching takes place even in the event of unbalanced voltages from the power supply system.

At least one embodiment of the present invention makes it possible to achieve virtually the same functionality with two-phase three-phase controllers, in terms of the reduction in the starting currents and torques during starting, as is possible with two-phase three-phase controllers.

BRIEF DESCRIPTION OF THE DRAWINGS

Further advantageous embodiments of the invention are specified in the dependent claims, and will be explained in more detail in the following text with reference to drawings based on one example embodiment. In this case:

DETAILED DESCRIPTION OF THE EXAMPLE EMBODIMENTS

Figure 1:
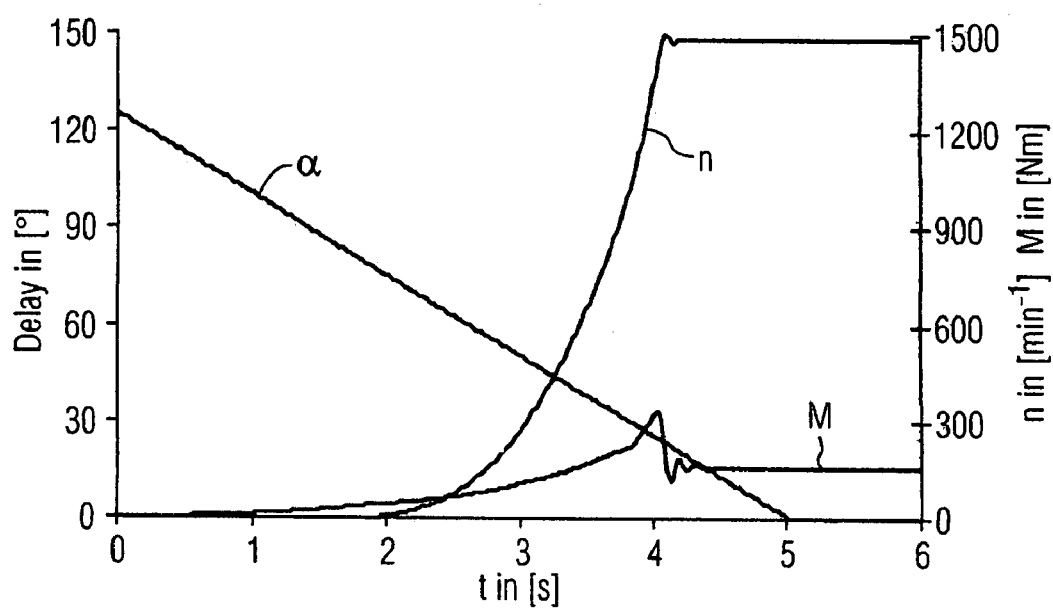
FIG. 1 shows phase gating, rotation speed and torque for a three-phase controller according to the prior art.

A three-phase controller (a soft starter) for phase gating control for an asynchronous machine, as is known in the prior art, will be used as an example. Only the control of the three-phase controller, which is provided by its control unit, has modifications, which allow operation of the three-phase controller in the sense of an embodiment of the invention. Since the control unit generally has a microprocessor or microcontroller in addition to measurement units, such as current transformers and the like, these modifications are preferably in the form of a computer program, which runs in the microprocessor or microcontroller, or in any other desired form, for example in the form of a hard-wired circuit.

By way of example, the following example embodiment is based on the assumption that both the outer conductors L1 and L3 are controlled and that the outer conductor L2 (physically located in the centre) in the three-phase controller, is connected through, for example by way of a copper link. According to an embodiment of the invention, the root mean square values $I_{1rms}$ and $I_{3rms}$ are intended to be matched. For this purpose, the control unit for the three-phase controller first of all calculates a control error $\Delta I$ using:

$$\Delta I_k = (I_{1rms(k)} - I_{3rms(k)})/I_N \quad \text{(Equation 1)}$$

The index k denotes values relating to the sampling time $t=k \cdot T_A$, in which case $T_A$ may be the power supply system period, for which $T_A = 20$ ms, for a 50 Hz power supply system. A new calculation is in this case carried out once per power supply system period. However, sampling can be carried out every two, three or four power supply system periods, etc. The control error according to equation 1 is in this case normalized with respect to the rating current $I_N$ of the three-phase controller, that is to say it is dimensionless.

The "global" trigger delay $\alpha$, which indicates the time period between the off-gating of the current and the next trigger, is predetermined in a known manner by the controller for the three-phase controller on the basis of the parameters selected on the appliance (start voltage, ramp time and the like). In order to obtain identical root mean square values in the two controlled outer conductors L1 and L3, a specific trigger delay $\alpha 1$ and $\alpha 3$ must be derived from the "global" trigger delay a for each controlled outer conductor, that is to say for each thyristor valve set. These trigger delays, which are associated with the outer conductors L1 and L3, are calculated as follows during the starting-up process in the control unit from the "global" trigger delay $\alpha$:

$$\alpha_{1(k)} = \alpha_k - \Delta \alpha_k / 2$$

$$\alpha_{3(k)} = \alpha_k + \Delta \alpha_k / 2 \quad \text{(Equation 2)}$$

It follows from equation 2 that the mean value of the two trigger delays $\alpha 1$ and $\alpha 3$ corresponds to the "global" trigger delay $\alpha$, but their difference corresponds to the difference trigger delay $\Delta \alpha$. In a further step, the difference time delay $\Delta \alpha$ is now determined on the basis of the current difference $\Delta I$. This is done on the basis of the following equation:

$$\Delta \alpha_k = K_I \cdot T_A \sum_{v=0}^{k-1} \Delta Iv \quad \text{(Equation 3)}$$

Thus, the difference between the currents in the two outer conductors L1 and L3 is added up from the start of the starting process over the number of power supply system periods that have passed, and the difference trigger delay $\Delta \alpha$ is determined from this sum using equation 3 (discrete-time integral regulator). The constant $K_I$ in equation 3, which is also referred to as the regulated gain, advantageously assumes values in a range from about 0.03 to 0.05 in a 50 Hz power supply system. A $K_I$ value of 0.05 is particularly advantageous in this case. Excessively large $K_I$ values would in this case lead to system instability.

The same phase gating is therefore no longer predetermined as in the past for each outer conductor and for each valve set. In fact, according to an embodiment of the invention, different phase gating times, that is to say different trigger delays, are provided for the two control phases. In this case, the method according to an embodiment of the invention is distinguished in that the matching is carried out on the basis of instantaneous measurement data, so to speak "on-line". There is no need to use imprecise estimates or prior calculations.

The calculation method specified in an embodiment of the invention and should be regarded as an example and may, of course, be modified within the scope of the invention.

The effectiveness of the method according to an embodiment of the invention will become clear from the figures described in the following text.

Figure 2:
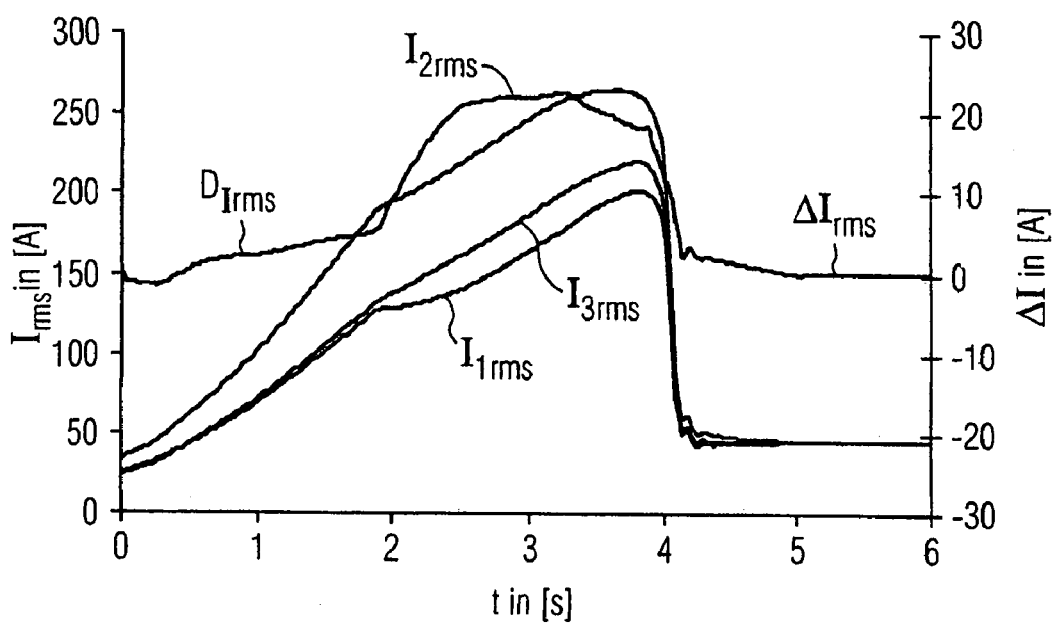
FIG. 2 shows a profile of the root mean square values of the currents and of the current difference for a three-phase controller according to the prior art.

FIG. 1 shows the phase gating (delay $\alpha$) in degrees, the rotation speed n in rpm, in the torque M in Nm over time t in seconds for a conventional three-phase controller. FIG. 2 shows the profile of the root mean square values of the currents I1, I2 and I3 over the same time period, as well as the difference between the currents in the controlled outer conductors, using the example of a 30 kW asynchronous machine.

With a trigger delay of approximately $\alpha = 77°/180° \cdot 10$ ms=4.3 ms, the current root mean square values drift increasingly away from one another in the two controlled outer conductors L1 and L2. $I_{3rms}$ is greater than $I_{1rms}$ by about 22 amperes, making up about 40% of the rated current ($I_N = 55$ amperes). The maximum values of the root mean square currents are 202 amperes (L1) and 220 amperes (L3).

Figure 3:
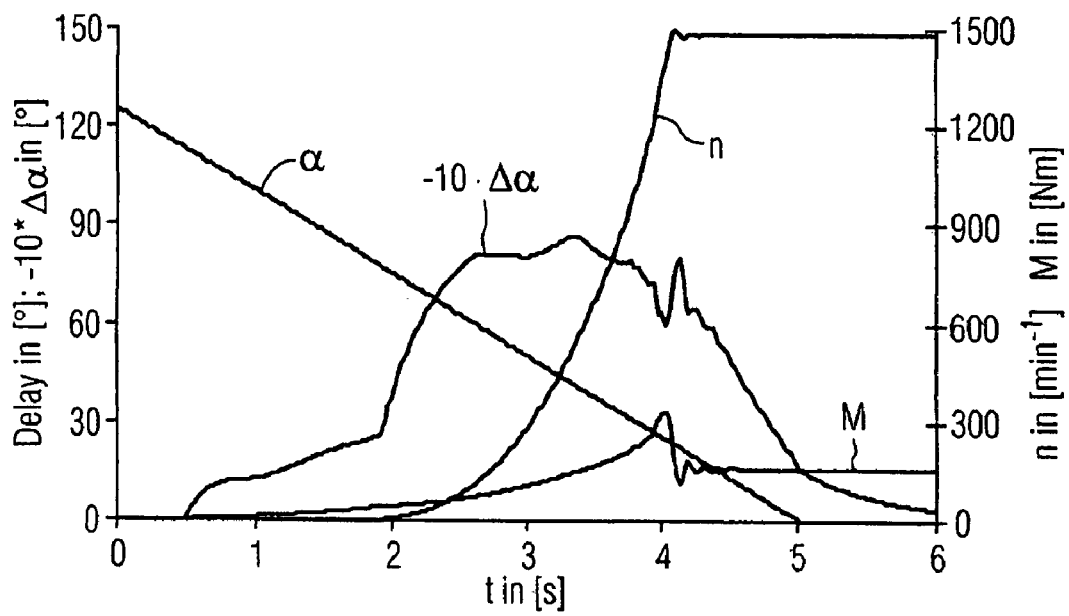
FIG. 3 shows a phase gating, rotation speed and torque for a three-phase controller according to an embodiment of the invention.
Figure 4:
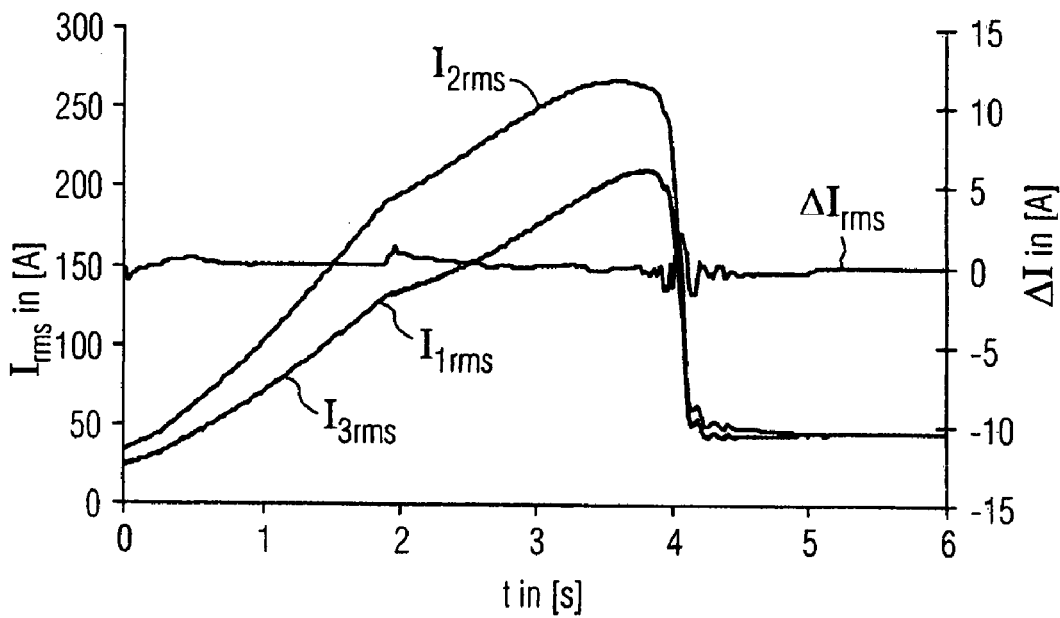
FIG. 4 shows a profile of the root mean square values of the currents and of the current difference for a three-phase controller according to an embodiment of the invention.

If the three-phase controller used by FIGS. 1 and 2 is operated using the method according to an embodiment of the invention, then this results in the characteristics shown in FIGS. 3 and 4. In this case, for clarity reasons, 10 times the negative value is illustrated for the difference trigger delay $\Delta \alpha$ in FIG. 3. As can be seen from FIG. 4, the root mean square values $I_{1rms}$, $I_{3rms}$ of the currents in the two controlled outer conductors L1 and L3 are largely matched to one another. The maximum value for the two outer conductors is now about 210 amperes, that is to say approximately in the centre between the maximum values shown in FIG. 2.

Figure 5:
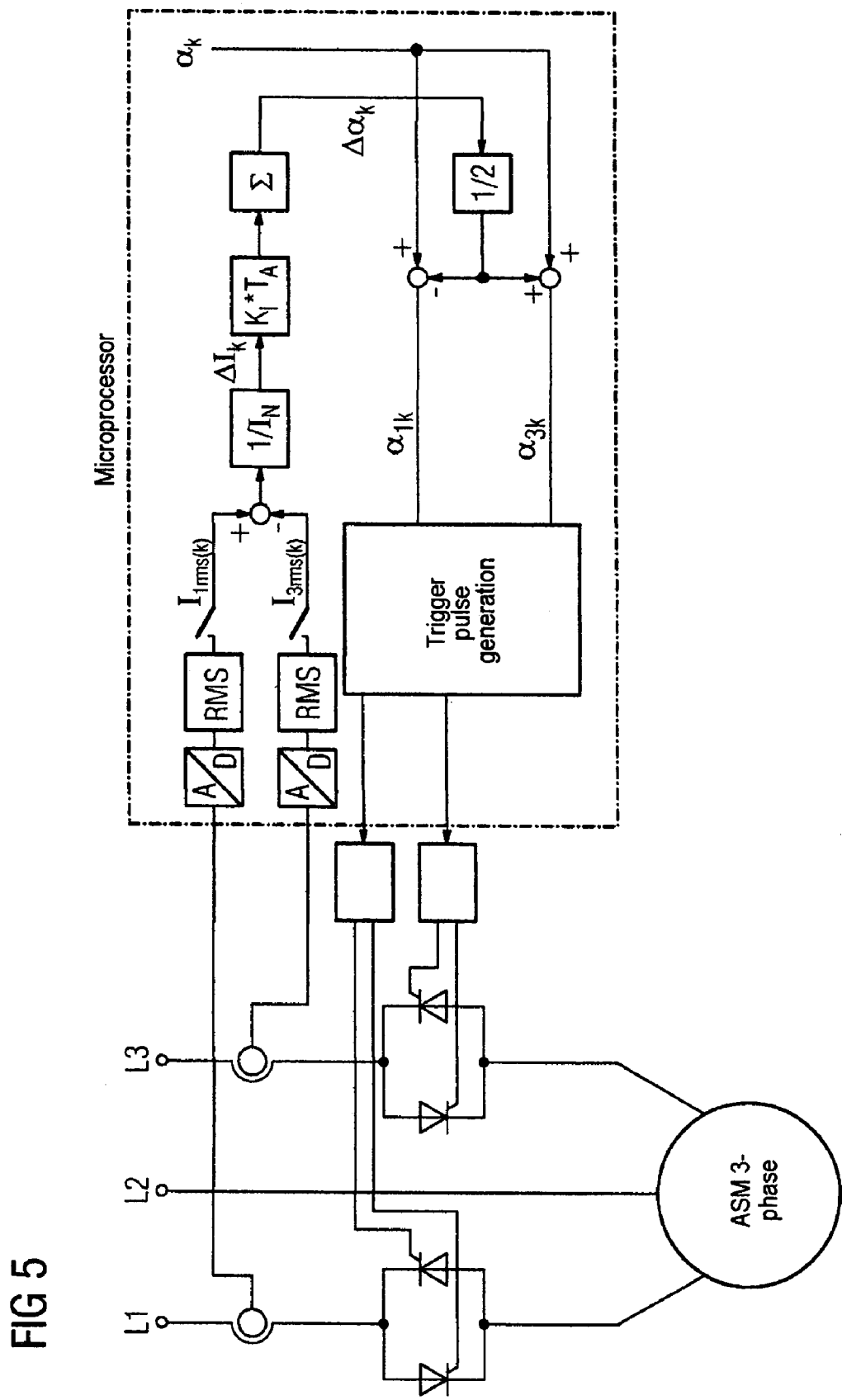
FIG. 5 shows a schematic illustration of the method according to an embodiment of the invention.

FIG. 5 shows a simplified schematic illustration of a three-phase controller according to an embodiment of the invention for an asynchronous machine (ASM). In this case, the currents in the two controlled outer conductors L1 and L3 are measured by means of current transformers. The measurement signal is supplied to an A/D converter for a microprocessor. The root mean square value of the current for one power supply system cycle is calculated from the digitized values by way of known methods. The two root mean square values are subtracted from one another, are related to the rated current $I_N$, and are weighted with the factor $K_I * T_a$.

The value weighted in this way is subjected to an addition process, from which the difference trigger delay $\Delta \alpha$ is determined. The difference trigger delay $\Delta \alpha$ is respectively subtracted from the global trigger delay $\alpha$ (L1) or is added to it (L3). This results in the individual trigger delays $\alpha 1$ and $\alpha 3$ for the two controlled outer conductors L1 and L3. The two trigger delays $\alpha 1$ and $\alpha 3$ are supplied to circuit logic, which uses them to generate the corresponding trigger pulses for the thyristors.

Example embodiments being thus described, it will be obvious that the same may be varied in many ways. Such variations are not to be regarded as a departure from the spirit and scope of the present invention, and all such modifications as would be obvious to one skilled in the art are intended to be included within the scope of the following claims.

The invention claimed is:

1. A method for operation of a two-phase three-phase controller in a three-phase power supply system, with phase gating control being carried out in two control phases, the method comprising:
   detecting root mean square values of the currents flowing in the two control phases;
   adding a difference between the currents flowing in the two control phases;
   determining a trigger delay from the added-up difference between the currents flowing in the two control phases; and
   increasing a trigger angle of the first control phase and reducing a trigger angle for the second control phase by the determined trigger delay such that root mean square values in the two control phases are matched.

2. The method as claimed in claim 1, wherein the root mean square values of the currents flowing in the two control phases are detected at least in each power supply system cycle.

3. The method as claimed in claim 2, wherein the root mean squire values are determined from digitized values.

4. The method as claimed in claim 3 wherein a control gain in the range from 0.03 to 0.05 is used.

5. The method as claimed in claim 2, wherein a control gain in the range from 0.03 to 0.05 is used.

6. The method as claimed in claim 1, wherein the root mean square values are determined from digitized values.

7. The method as claimed in claim 6 wherein a control gain in the range from 0.03 to 0.05 is used.

8. The method as claimed in claim 1 wherein a control gain in the range from 0.3 to 0.05 is used.

9. A two-phase three-phase controller for phase gating control of two control phases in a three-phase power supply system, comprising;
   detection means for detection of root mean square values of the currents flowing in the two control phases; and
   a control unit, connected to the detection means and including addition means for addition of a difference between the currents flowing in the two control phases, to determine and generate a trigger delay from the added-up difference between the currents flowing in the two control phases, such that root mean square values in the two control phases are matched by increasing the trigger angle of the first control phase and by reducing the trigger angle for the second control phase.

10. The two-phase three-phase controller as claimed in claim 9, wherein the root mean square values of the currents flowing in the two control phases are detected at least in each power supply system cycle.

11. The two-phase three-phase controller as claimed in claim 9, wherein the root mean square values are determined from digitized values.

12. The two-phase three-phase controller as claimed in claim 9,
   wherein a control gain in the range from 0.03 to 0.05 is used.

* * * * *